US 7,924,118 B2

(12) United States Patent
Yonekura

(10) Patent No.: US 7,924,118 B2
(45) Date of Patent: Apr. 12, 2011

(54) DUPLEXER AND ELASTIC WAVE DEVICE

(75) Inventor: Hiroshi Yonekura, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/625,653

(22) Filed: Nov. 25, 2009

(65) Prior Publication Data

US 2010/0066461 A1 Mar. 18, 2010

Related U.S. Application Data

(63) Continuation of application No. PCT/JP2008/055434, filed on Mar. 24, 2008.

(30) Foreign Application Priority Data

May 28, 2007 (JP) ................................. 2007-140586

(51) Int. Cl.
*H03H 9/72* (2006.01)
(52) U.S. Cl. .......................... 333/133; 333/195; 333/193
(58) Field of Classification Search .................. 333/193, 333/195, 133
See application file for complete search history.

(56) References Cited

U.S. PATENT DOCUMENTS

| | | | | |
|---|---|---|---|---|
| 7,283,016 | B2 * | 10/2007 | Haruta et al. | ................. 333/133 |
| 7,619,491 | B2 * | 11/2009 | Takata et al. | ................... 333/133 |
| 2003/0030512 | A1 | 2/2003 | Takamine | |
| 2003/0090338 | A1 | 5/2003 | Muramatsu | |
| 2003/0214369 | A1 | 11/2003 | Kearns | |
| 2004/0155730 | A1 | 8/2004 | Iwamoto et al. | |
| 2005/0242903 | A1 * | 11/2005 | Inoue et al. | ................... 333/195 |
| 2006/0132260 | A1 | 6/2006 | Iwamoto et al. | |
| 2008/0266023 | A1 * | 10/2008 | Tanaka | ........................... 333/133 |

FOREIGN PATENT DOCUMENTS

| | | |
|---|---|---|
| EP | 1 592 130 A2 | 11/2005 |
| JP | 2003-124782 A | 4/2003 |
| JP | 2003-198325 A | 7/2003 |
| JP | 2003-249842 A | 9/2003 |
| JP | 2003-347964 A | 12/2003 |
| JP | 2005-318307 A | 11/2005 |
| JP | 2006-180192 A | 7/2006 |

OTHER PUBLICATIONS

Official Communication issued in International Patent Application No. PCT/JP2008/055434, mailed on Jul. 15, 2008.

* cited by examiner

*Primary Examiner* — Robert Pascal
*Assistant Examiner* — Alan Wong
(74) *Attorney, Agent, or Firm* — Keating & Bennett, LLP

(57) ABSTRACT

In a duplexer, a transmission elastic wave filter and a reception elastic wave filter are mounted on a laminated substrate, a coil connected between an antenna terminal and a ground potential is provided on the laminated substrate, the reception elastic wave filter has first and second ground pads connected to ground potentials of IDTs connected to first and second balanced terminals, the distance between the second ground pad and the coil is greater than the distance between the first ground pad and the coil, and an inductance component in a conductive path E connecting the second ground pad to the second ground terminal is less than an inductance component in a conductive path D connecting the first ground pad to the first ground terminal, so as to improve isolation characteristics between first and second balanced terminals of a reception filter chip.

8 Claims, 10 Drawing Sheets

DUPLEXER AND ELASTIC WAVE DEVICE

BACKGROUND OF THE INVENTION

1. Field of the Invention

The present invention relates to duplexers used in RF stages of mobile phone devices, for example, and elastic wave devices which can be used as the duplexers. More particularly, the present invention relates to a duplexer having improved isolation between a transmission terminal and a balanced terminal of a reception bandpass filer and an elastic wave device which is used for the duplexer.

2. Description of the Related Art

Duplexers have been in widespread use in RF stages of mobile phone devices for the purpose of reducing the number of components thereof. For example, Japanese Unexamined Patent Application Publication No. 2003-347964 discloses a duplexer 1001 having a circuit configuration illustrated in FIG. 16.

In the duplexer 1001, a transmission filter chip 1003 and a reception filter chip 1004 are mounted on a substrate 1002. An antenna terminal 1005 is connected to an external antenna 1006. The transmission filter chip 1003 has a ladder circuit configuration including a plurality of series arm resonators S1 to S4 and a plurality of parallel arm resonators P1 and P2. The series arm resonators S1 to S4 and the parallel arm resonators P1 and P2 are each defined by surface acoustic wave resonators. The transmission filter chip 1003 includes a transmission terminal 1007 at one end thereof. A transmission signal is input from the transmission terminal 1007 and supplied to the antenna 1006 via the antenna terminal 1005.

On the other hand, the reception filter chip 1004 is connected to the antenna terminal 1005 via a matching circuit 1008. The reception filter chip 1004 is defined by a surface acoustic wave filter device and has a balanced-unbalanced conversion function. That is, an unbalanced input terminal 1009 of the reception filter chip 1004 is connected to the antenna terminal 1005. The reception filter chip 1004 includes first and second balanced terminals 1010 and 1011.

In addition, the reception filter chip 1004 is defined by a surface acoustic wave filter device having a plurality of IDTs. The configuration of the surface acoustic wave filter device is herein schematically illustrated. One end of a first IDT 1012 disposed at the center is connected to the unbalanced input terminal 1009, and the other end of the first IDT 1009 is connected to a ground potential. One end of each of the second and third IDTs 1013 and 1014 is electrically connected to a ground potential, and the other end of each of the second and third IDTs 1013 and 1014 is electrically connected to the first and second balanced terminals 1010 and 1011, respectively.

Although not described in Japanese Unexamined Patent Application Publication No. 2003-347964, in a configuration which has been conventionally used, the matching circuit 1008 includes a SAW resonator that is connected between the antenna terminal 1005 and the unbalanced terminal 1009, and a coil that is connected between a node between the surface acoustic wave resonator and the antenna terminal 1005 and a ground potential.

In the manufacturing of the matching circuit 1008, when the above configuration including the SAW resonator and the coil is mounted inside the substrate 1002 in order to decrease the size thereof, in the conventional duplexer, isolation characteristics between the first and second balanced terminals 1010 and 1011 and the transmission terminal 1007 of the transmission filter chip 1003 may be deteriorated. This may decrease the attenuation in a pass band of the transmission filter chip 1003 and in attenuation-frequency characteristics of the reception filter chip 1004.

SUMMARY OF THE INVENTION

To overcome the problems described above, preferred embodiments of the present invention provide a duplexer which improves the isolation characteristics between the transmission terminal and the first and second balanced terminals of the reception filter chip, and an elastic wave device which can be used as the duplexer.

According to a preferred embodiment of the present invention, a duplexer includes a transmission elastic wave filter, a reception elastic wave filter, and a laminated substrate on which the transmission elastic wave filter and the reception elastic wave filter are mounted, wherein the transmission elastic wave filter includes a first piezoelectric substrate, a first filter unit provided on the first piezoelectric substrate, and a transmission output pad provided on a bottom surface of the first piezoelectric substrate and connected to the first filter unit, wherein the reception elastic wave filter includes a second piezoelectric substrate, a second filter unit provided on the second piezoelectric substrate, an unbalanced pad, and first and second balanced pads, the unbalanced pad and the first and second balanced pads being provided on a bottom surface of the second piezoelectric substrate and connected to the second filter unit, wherein the second filter unit includes a first longitudinally-coupled filter device having at least one first IDT of which one end is connected to the unbalanced pad and a second longitudinally-coupled filter device having at least one second IDT of which one end is connected to the unbalanced pad, in which the phase of an output signal relative to an input signal is different by 180 degrees from the phase of an output signal relative to an input signal in the first filter device, a first ground pad to which the other end of the first IDT is connected, and a second ground pad to which the other end of the second IDT is connected, wherein the laminated substrate includes first and second ground lands electrically connected to the first and second ground pads, respectively, a common land electrically connected to the transmission output pad and the unbalanced pad, and a common ground electrode to which the other end of the first IDT and the other end of the second IDT are commonly connected, a first inductance component connected between the first ground land and the common ground electrode, a second inductance component connected between the second ground land and the common ground electrode, and a coil connected between the common land and the common ground electrode, and wherein the distance between the second ground pad and the coil is greater than the distance between the first ground pad and the coil, and the second inductance component is less than the first inductance component.

Preferably, the laminated substrate is defined by a plurality of dielectric layers, and the common ground electrode is provided between two adjacent dielectric layers of the laminated substrate, the first and second inductance components and the coil are preferably each provided with conductors provided on the top surface of the laminated substrate and/or on an interface between adjacent dielectric layers and with via-hole conductors penetrating at least one of the dielectric layers and connected to the conductors, and the entire length of a structure including continuously disposed conductors and the via-hole conductors defining the first inductance component is preferably greater than the entire length of a structure including the continuously disposed conductors and the via-hole conductors defining the second inductance component. In this case, the entire length of the structure including the first inductance component which is defined by a successive series of the conductors and the via-hole conductors is preferably relatively large. This arrangement provides a configuration in which the inductance of the second inductance component is less than the inductance of the first inductance component.

In addition, preferably, the via-hole conductors defining the second inductance component include at least two via-hole conductors penetrating at least one of the dielectric layers. Accordingly, by providing at least two via-hole conductors, the second inductance component can be decreased without increasing the size of the laminated substrate.

In a preferred embodiment of the present invention, the plurality of dielectric layers are disposed between the first and second ground pads provided on the laminated substrate and the common ground electrode.

Further, preferably, the duplexer according to various preferred embodiments of the present invention further includes a mount substrate on which first to third ground terminals provided on the bottom surface of the laminated substrate and the laminated substrate are mounted, wherein respective ends of the first and second inductance components and the coil are electrically connected to the respective first to third ground terminals, and the common ground electrode is provided on the mount substrate. In this case, the individual inductance components can be precisely adjusted.

Preferably, the coil is arranged so as not to overlie a conductor connected to the common ground electrode when the laminated substrate is viewed in plan. In this case, the distance between the common ground electrode and the coil can be increased, and thus, the distance between the second ground pad and coil can be reliably further increased.

In the duplexer according to various preferred embodiments of the present invention, a surface acoustic wave and an elastic boundary wave may preferably be used as an elastic wave, for example.

An elastic wave device according to a preferred embodiment of the present invention includes an elastic wave filter, a laminated substrate having a top surface and a bottom surface, the top surface being mounted with the elastic wave filter, and first and second balanced terminals provided on the bottom surface of the laminated substrate, wherein the elastic wave filter includes a piezoelectric substrate, an unbalanced pad and first and second balanced pads provided on the piezoelectric substrate, a first longitudinally-coupled filter device having at least one first IDT of which one end is connected to the unbalanced pad, and a second longitudinally-coupled filter device having at least one second IDT of which one end is connected to the unbalanced pad, in which the phase of an output signal relative to an input signal is different by 180 degrees from the phase of an output signal relative to an input signal in the first filter device, wherein the laminated substrate includes a first ground land electrically connected to the other end of the first IDT and a second ground land electrically connected to each of the other ends of the second IDT, a common ground electrode to which the other end of the first IDT and the other end of the second IDT are commonly connected, a first inductance component provided between the first ground land and the common ground electrode, and a second inductance component provided between the second ground land and the common ground electrode, and wherein the magnitude of the first inductance component is different from the magnitude of the second inductance component.

Preferably, the distance between the second ground pad and the coil is greater than the distance between the first ground pad and the coil. Thus, the influence of a magnetic field generated when a transmission signal is supplied to the coil is relatively large in the first ground pad. However, since the second inductance component is less than the first inductance component, the influence of the magnetic field can be minimized and prevented between the second ground pad and the coil. Accordingly, the amplitude balance and the phase balance between the first and second balanced terminals and the isolation characteristics can be improved.

Thus, in a duplexer which enables downsizing using a reception elastic wave filter having a balanced-unbalanced function, the isolation characteristics can be improved without increasing the size or complicating the structure thereof.

In addition, in the elastic wave device according to various preferred embodiments of the present invention, as described above, the first inductance component and the second inductance component are different from one another. Thus, the amplitude balance and the phase balance between the first and second balanced terminals are effectively improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

In the following, preferred embodiments of the present invention will be described with reference to the drawings.

Figure 1:
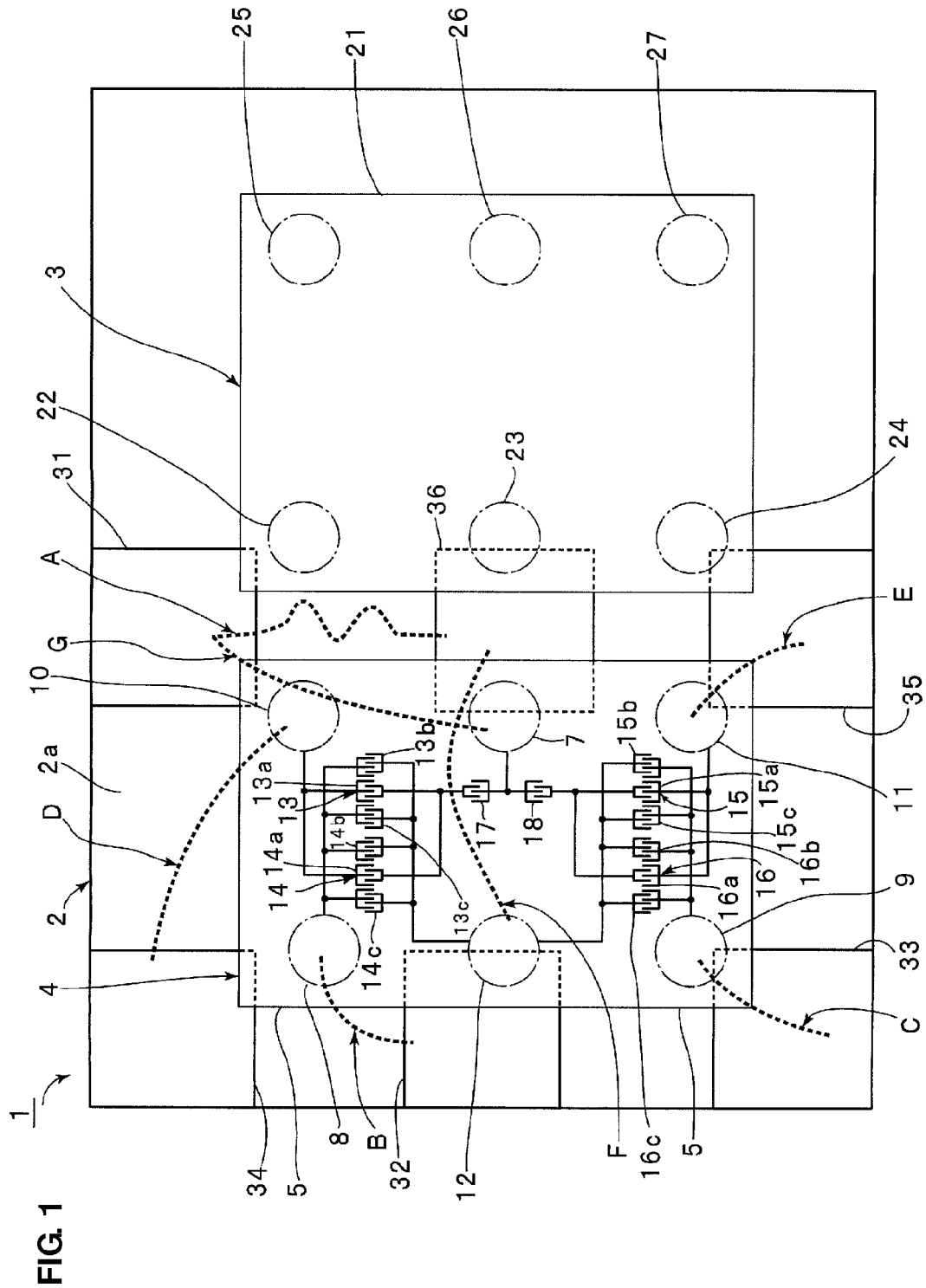
FIG. 1 is a schematic plan view of a duplexer according to a preferred embodiment of the present invention.
Figure 2:
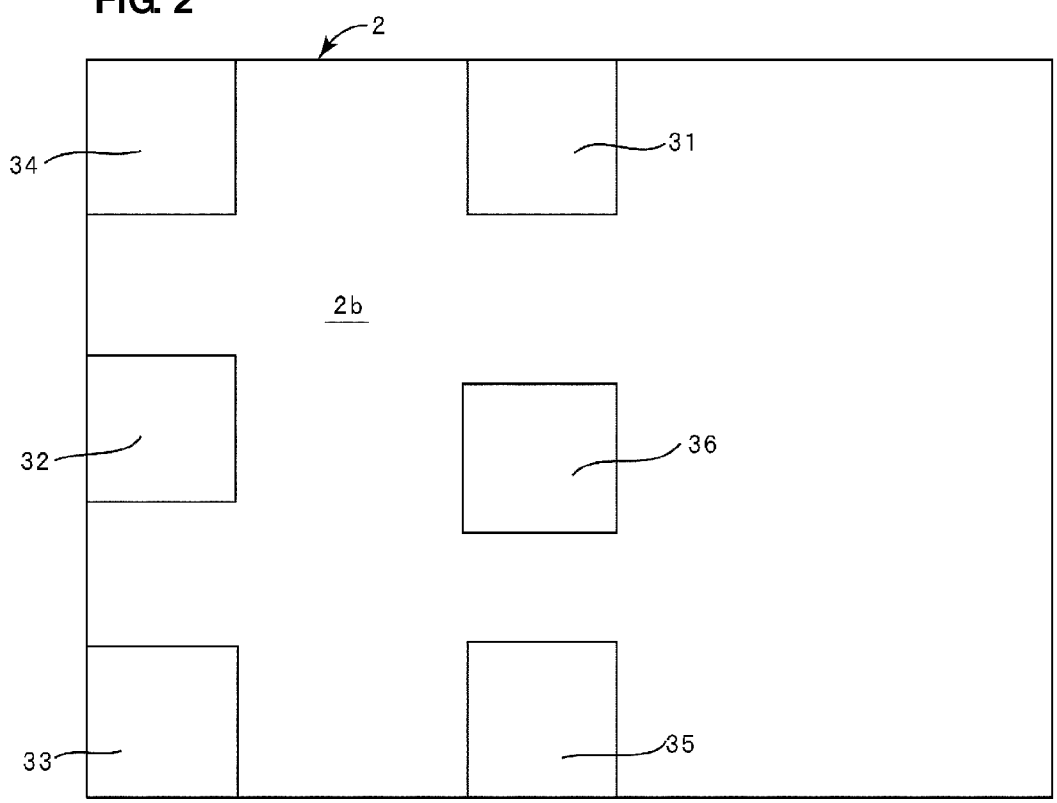
FIG. 2 is a plan view schematically illustrating an electrode structure on the bottom surface of a laminated substrate used in the duplexer shown in FIG. 1.

FIG. 1 is a schematic plan view of a duplexer according to a preferred embodiment of the present invention. FIG. 2 is a plan view schematically illustrating a terminal structure provided on the bottom surface of a laminated substrate used in the duplexer shown in FIG. 1. In FIG. 2, the terminal structure on the bottom surface is shown via a perspective view of the laminated substrate.

It is noted that in FIG. 1, illustration of an electrode structure on the top surface of a laminate structure 2 which will be described below is omitted, and an electrical connection structure of the terminal structure on a bottom surface 2b of the laminated substrate 2 and terminal structures of a transmission elastic wave filter and a reception elastic wave filter mounted on a top surface 2a of the laminated substrate 2 is schematically illustrated via a perspective view of the laminated substrate 2.

As illustrated in FIG. 1, a duplexer 1 includes the laminated substrate 2. The laminated substrate 2 has a structure in which a plurality of dielectric layers are laminated. A transmission elastic wave filter 3 and a reception elastic wave filter 4 are mounted on the top surface 2a of the laminated substrate 2. The reception elastic wave filter 4 includes a piezoelectric substrate 5. A surface acoustic wave filter is fabricated by forming the electrode structure schematically shown in FIG. 1 on the bottom surface of the piezoelectric substrate 5. The material defining the piezoelectric substrate 5 is not particularly limited to any specific material, and any appropriate piezoelectric ceramics or piezoelectric single crystal may preferably be used.

With the electrode structure provided on the bottom surface of the piezoelectric substrate 5, a surface acoustic wave filter unit defining a second filter unit according to a preferred embodiment of the present invention is provided.

In addition, downward protruding metal bumps are provided at positions indicated by circles of dotted-chain lines on the bottom surface of the piezoelectric substrate 5. Then, the individual metal bumps are disposed on electrode pads provided on the bottom surface of the piezoelectric substrate 5. To simplify the description, it is assumed that the electrode pads are provided at the positions of the metal bumps which are enclosed by the circles described above, and that individual sections enclosed by the circles of dotted-chain lines define electrode pads. The electrode pads on the bottom surface of the piezoelectric substrate 5 preferably include an unbalanced pad 7, first and second balanced pads 8 and 9, first and second ground pads 10 and 11, and a balanced ground pad 12. These electrode pads are preferably provided by forming conductive films made of an appropriate metal, such as Al and Cu or an alloy, for example, on the bottom surface of the piezoelectric substrate 5. As described above, the metal bumps preferably made of Au or a solder, for example, are provided on the individual electrode pads so as to protrude downward.

The second filter unit includes first to fourth longitudinally-coupled resonator SAW filters 13 to 16 and one-terminal-pair SAW resonators 17 and 18. Specifically, the first and second longitudinally-coupled resonator SAW filters 13 and 14 are connected to the unbalanced pad 7 via the one-terminal-pair SAW resonator 17. The first and second longitudinally-coupled resonator SAW filters 13 and 14 preferably are both three-IDT SAW filters. Ends of the center IDTs 13a and 14a of the first and second longitudinally-coupled resonator SAW filters 13 and 14 are connected to the unbalanced pad 7 via the one-terminal-pair SAW resonator 17. The other ends of the IDTs 13a and 14a are commonly connected and are electrically connected to the first ground pad 10. In addition, ends of IDT 13b, 13c, 14b, and 14c respectively disposed on the opposite sides of the respective IDT 13a and 14a in the surface wave propagation direction are commonly connected and are connected to the first balanced pad 8, and the other ends are commonly connected are electrically connected to the balanced ground pad 12.

In addition, ends of IDTs 15a and 16a at the center of the third and fourth longitudinally-coupled resonator SAW filters 15 and 16 are electrically connected to the unbalanced pad 7 via the one-terminal-pair SAW resonator 18, and the other ends of the IDTs 15a and 16a are commonly connected and electrically connected to the second ground pad 11. In the third and fourth longitudinally-coupled resonator SAW filters 15 and 16, individual terminals of IDTs 15b, 15c, 16b, and 16c respectively disposed on the opposite sides of the respective IDTs 15a and 16a in the surface wave propagation direction are commonly connected and are electrically connected to the second balanced pad 9, and the other terminals are commonly connected and are connected to the balanced ground pad 12.

The second filter unit preferably includes the unbalanced pad 7 as the unbalanced terminal and includes the first and second balanced terminals 8 and 9 as the first and second balanced terminals.

Accordingly, the second filter unit described above is a surface acoustic wave filter which has the first to fourth longitudinally-coupled resonator filters 13 to 16 and has a balanced-unbalanced conversion function.

Figure 3:
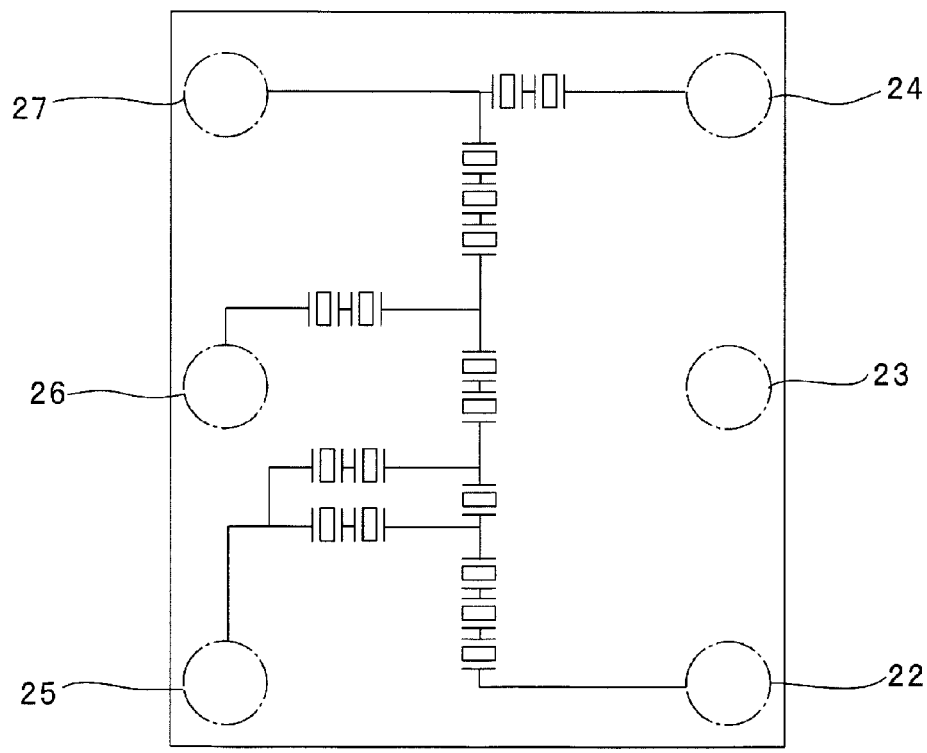
FIG. 3 is a circuit diagram illustrating a circuit configuration of a transmission elastic wave filter in the preferred embodiment shown in FIG. 1.

On the other hand, the transmission elastic wave filter 3 includes a piezoelectric substrate 21. Electrode pads 22 to 27 are provided on the bottom surface of the piezoelectric substrate 21 as indicated by dotted-chain lines. An electrode structure which is schematically illustrated in FIG. 3 is provided on the bottom surface of the piezoelectric substrate 21, and thus, a first filter unit on the transmission side is provided. As illustrated in FIG. 3, the first filter unit is a ladder surface acoustic wave filter having unbalanced input/unbalanced output.

Referring to FIG. 1, the unbalanced pad 7, the first and second balanced pads 8 and 9, the first and second ground pads 10 and 11, and the balanced ground pad 12 are electrically connected to terminals provided on the side of the laminated substrate 2. In FIGS. 1 and 2, a plurality of terminals provided on the bottom surface 2b of the laminated substrate 2 are illustrated by perspectively viewing the laminated substrate 2. An antenna terminal 31, first and second balanced terminals 32 and 33, first and second ground terminals 34 and 35, and a third ground terminal 36 are provided on the bottom surface 2b of the laminated substrate 2. These terminals are preferably made of appropriate metal films, such as Au and Ag, for example. The antenna terminal 31 is preferably arranged to connect the duplexer 1 to an antenna. In addition, the first and second balanced terminals 32 and 33 are arranged to supply reception output to an amplifier or other component connected at a downstream side of the reception elastic wave filter 4.

The first to third ground terminals 34 to 36 are arranged to be connected to an external ground potential.

On the other hand, the unbalanced pad 7, the first and second balanced pads 8 and 9, the first and second ground pads 10 and 11, and the unbalanced ground pad 12 are electrically connected to the corresponding terminals 31 to 36 by conductive paths schematically illustrated by broken lines A to G in FIG. 1. These conductive paths A to G are formed inside the laminated substrate 2. In addition, as shown in FIG. 1 by a schematic symbol of a coil, a coil defining a matching circuit in the conductive path A is provided, as will be described below.

FIGS. 4A to 4F are schematic plan views illustrating electrode structures corresponding to different vertical locations of the laminated substrate 2 to describe the conductive paths inside the laminated substrate 2.

In the present preferred embodiment, the laminated substrate 2 preferably includes five dielectric layers that are laminated together, for example. Appropriate dielectric materials, such as dielectric ceramics, for example, may preferably be used to make the dielectric layers. In the present preferred embodiment, the laminated substrate 2 is preferably formed of a ceramic multilayer substrate fabricated by co-firing dielectric ceramic layers laminated via electrode structures described below.

Figure 4:
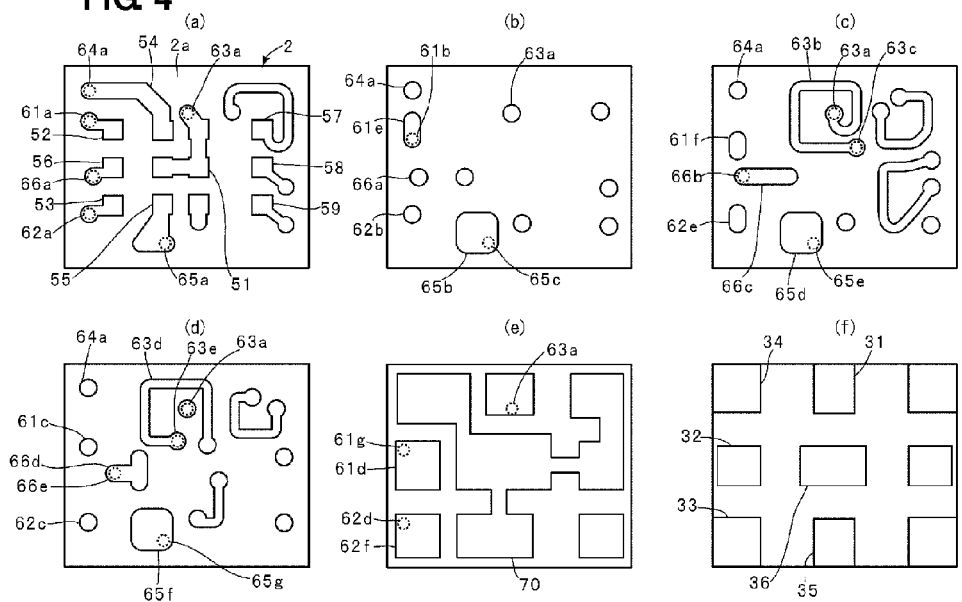
FIGS. 4A to 4F are schematic plan views illustrating individual electrode structures provided on different layers of a laminated substrate used in a preferred embodiment of the present invention.

The respective five layers of the laminated substrate 2 are defined as a first layer, a second layer, a third layer, a fourth layer, and a fifth layer, in that order from the bottom surface 2b to the top surface 2a. FIG. 4A illustrates the electrode structure provided on the top surface of the fifth layer, i.e., the top surface 2a of the laminated substrate 2, 4B illustrates the electrode structure provided between the fourth layer and the fifth layer, 4C illustrates the electrode structure provided between the third layer and the fourth layer, 4D illustrates the electrode structure provided between the second layer and the third layer, 4E illustrates the electrode structure provided on the interface between the first layer and the second layer, and 4F illustrates a terminal structure provided on the bottom surface 2b of the laminated substrate 2.

As illustrated in FIG. 4A, a common land 51 electrically connected to the unbalanced pad 7 of the reception elastic wave filter 4, first and second balanced lands 52 and 53 connected to the first and second balanced pads 8 and 9, first and second ground lands 54 and 55 connected to the first and second ground pads 10 and 11, and a balanced ground land 56 connected to the balanced ground pad 12 are provided on the top surface 2a of the laminated substrate 2. It is noted that the electrode lands 57 to 59 are electrode lands that are electrically connected to the transmission elastic wave filter, and the detailed description thereof will be omitted.

The first balanced land 52 is electrically connected to the first balanced terminal 32 through via-hole conductors 61a to 61d and conductors 61e to 61g penetrating the laminated substrate 2. That is, the via-hole conductors 61a to 61d, the conductors 61e to 61g and other suitable conductors define the conductive path B which is schematically illustrated in FIG. 1.

Similarly, the second balanced land 53 is electrically connected to the second balanced terminal 33 through via-hole conductors 62a to 62d and conductors 62e and 62f penetrating the laminated substrate 2. That is, the via-hole conductors 62a to 62d, the conductors 62e and 62f and other suitable conductors define the conductive path C which is schematically illustrated in FIG. 1.

The common land 51 is electrically connected to the third ground terminal 36 provided on the bottom surface 2b of the laminated substrate 2 by a via-hole conductor 63a, a coil pattern 63b, a via-hole conductor 63c, a coil pattern 63d, a via-hole conductor 63e, and other suitable conductors. That is, the via-hole conductors 63a, 63c, and 63e and the coil pattern 63b and 63d define the conductive path A which is schematically illustrated in FIG. 1. In this case, a coil is defined by the coil patterns 63b and 63d disposed at the different vertical positions inside the laminated substrate 2. The coil may preferably be formed by connecting coil patterns disposed at three or more different vertical positions through via-hole conductors. In addition, the coil may preferably be formed by only a single coil pattern disposed at a single vertical position in the laminated substrate 2.

In addition, the common land 51 is preferably electrically connected to the antenna terminal 31 provided on the bottom surface of the laminated substrate 2 through the conductive path G formed of the via-hole conductor 63a.

The first ground land 54 is connected to a common ground electrode 70 provided inside the laminated substrate 2 through the conductive path D defined by the via-hole conductor 64a, and to the first ground terminal 34 provided on the bottom surface of the laminated substrate 2.

The second ground land 55 is electrically connected to the common ground electrode 70 through a via-hole conductor 65a, a conductor 65b, a via-hole conductor 65c, a conductor 65d, a via-hole conductor 65e, a conductor 65f, and a via-hole conductor 65g. Then, eventually the second ground land 55 is electrically connected to the second ground terminal 35. That is, the conductive path E is defined by the via-hole conductor 65a, the conductor 65b, the via-hole conductor 65c, the conductor 65d, the via-hole conductor 65e, the conductor 65f, the via-hole conductor 65g, and other suitable conductors.

The first inductance component described above refers to an inductance component in a portion extending from the first ground land 54 to the common ground electrode 70 through the conductive path D mentioned above.

In addition, a second inductance component refers to an inductance component formed in a portion extending from the second ground land 55 and connected to the common ground electrode 70 through the conductive path E.

In addition, the balanced ground land 56 is electrically connected to the third ground terminal 36 provided on the bottom surface 2b of the laminated substrate 2 via the common ground electrode 70 by the conductive path F including via-hole conductors 66a, 66b, and 66e and conductors 66c and 66d.

In the characteristic of the duplexer 1 of the present preferred embodiment, the distance between the second ground pad 11 and the coil is preferably greater than the distance between the first ground pad 10 and the coil, and the second inductance component provided in the conductive path E is preferably less than the first inductance component provided in the conductive path D. With this arrangement, the amplitude balance and phase balance between the first and second balanced terminals 32 and 33 can be improved, and isolation can be improved in the transmission pass band in the reception elastic wave filter 4. This will be described in detail below.

Figure 6:
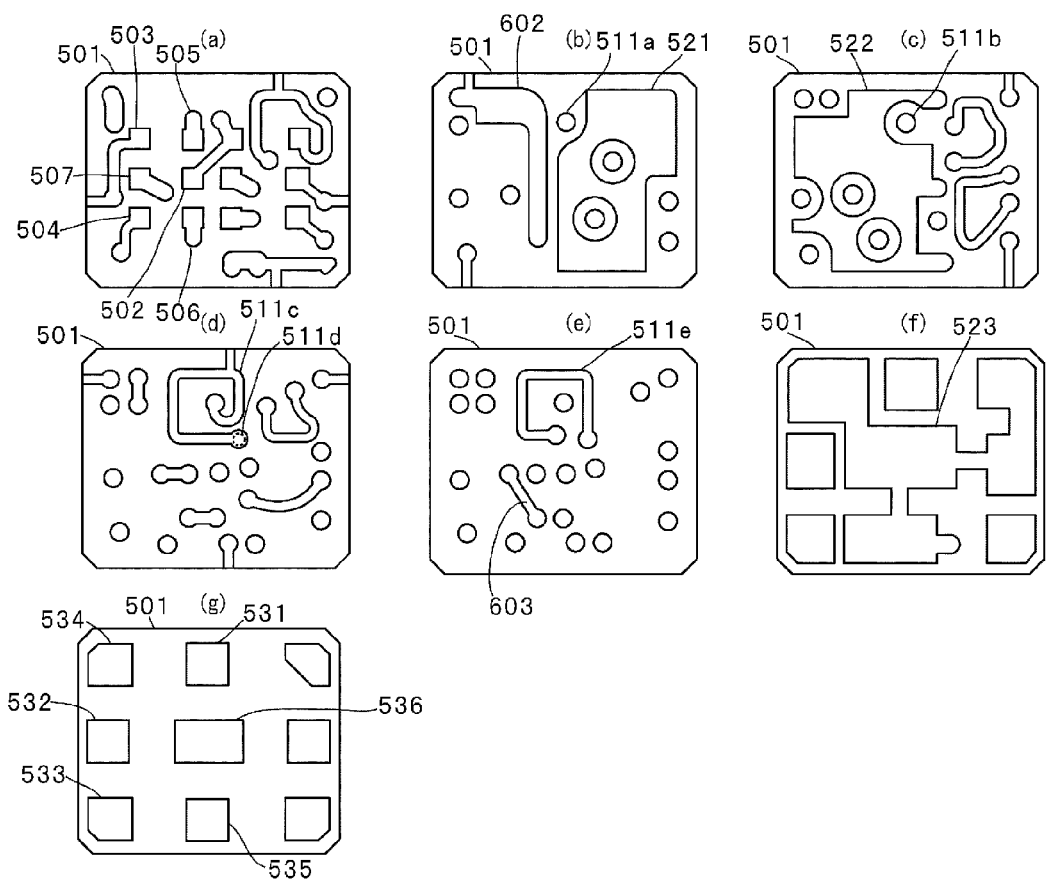
FIGS. 6A to 6G are plan views illustrating individual electrode structures provided on different layers of a laminated substrate of a conventional duplexer prepared for comparison.

For comparison, a structure of a laminated substrate used in a conventional duplexer is illustrated in FIGS. 6A to 6G. FIGS. 6A to 6G are schematic plan views illustrating electrode structures at individual vertical positions in a conventional laminated substrate 501 prepared for comparison. The laminated substrate 501 includes six dielectric layers. The six layers are named as a first layer, a second layer, a third layer, . . . , and a sixth layer, in the order from the bottom dielectric layer to the top dielectric layer. FIG. 6A illustrates the electrode structure on the top surface of the sixth layer, i.e., the top surface of the laminated substrate 501, 6B illustrates the electrode structure of the interface between the fifth layer and the sixth layer, 6C illustrates the electrode structure provided on the interface between the fourth layer and the fifth layer, 6D illustrates the electrode structure provided on the interface between the third layer and the fourth layer, 6E illustrates the electrode structure provided on the interface between the second layer and the third layer, 6F illustrates the electrode structure provided between the first layer and the second layer, and 6G illustrates a terminal structure provide on the bottom surface of the first layer, i.e., the bottom surface of the laminated substrate 501.

As illustrated in FIG. 6A, similar to the laminated substrate 2 of the preferred embodiment described above, a common land 502, first and second balanced lands 503 and 504, first and second ground lands 505 and 506, and a balanced ground land 507 are provided on the top surface of the laminated substrate 501. These electrode lands are electrically connected to individual terminals provided on the bottom surface of the laminated substrate 501 by via-hole conductors and electrodes illustrated in FIGS. 6B to 6E.

In this laminated substrate, a coil pattern 511c is connected to the common land 502 through via-hole conductors 511a and 511b. The coil pattern 511c is electrically connected to a coil pattern 511e provided below through a via-hole conductor 511d. That is, similar to the preferred embodiment described above, a coil having a plurality of coil patterns 511c and 511e is connected between the unbalanced terminal and an antenna terminal. Thus, a magnetic field generated when a current flows through the coil affects signals output from first and second balanced terminals.

Therefore, shield electrodes 521 and 522 having relatively large areas are provided, as illustrated in FIGS. 6B and 6C.

In addition, in the laminated substrate 501, a terminal structure similar to that in the above-described preferred embodiment is provided on the bottom surface. In FIG. 6G, terminal electrodes having substantially the same terminal structure shown in FIG. 4F are designated by reference numerals corresponding to those designating the terminal electrodes of the present preferred embodiment to which 500 has been added.

Figure 7:
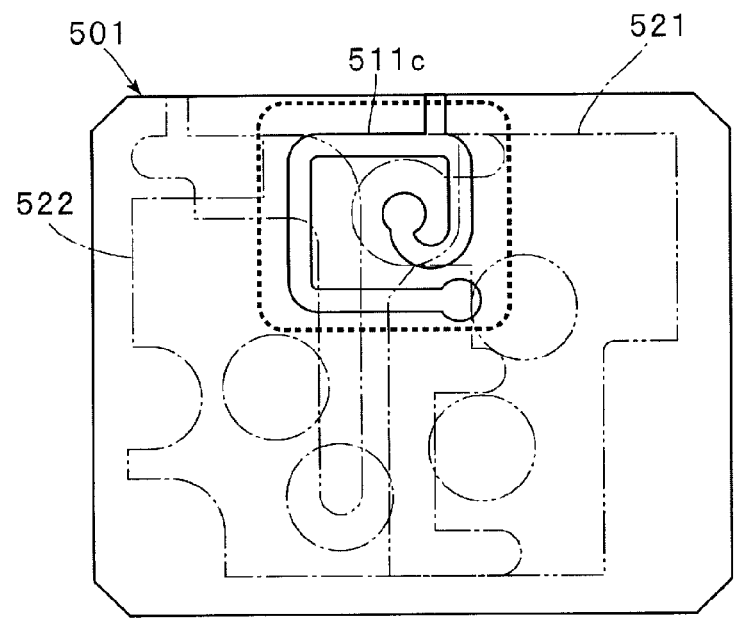
FIG. 7 is a schematic plan view illustrating a positional relationship between a coil pattern in the laminated substrate shown in FIGS. 6A to 6G and shield electrodes provided above the coil pattern.

FIG. 7 is a plan view schematically illustrating a positional relationship between the coil defined by the coil patterns 511c and 511e and the shield electrodes 521 and 522.

Figure 5:
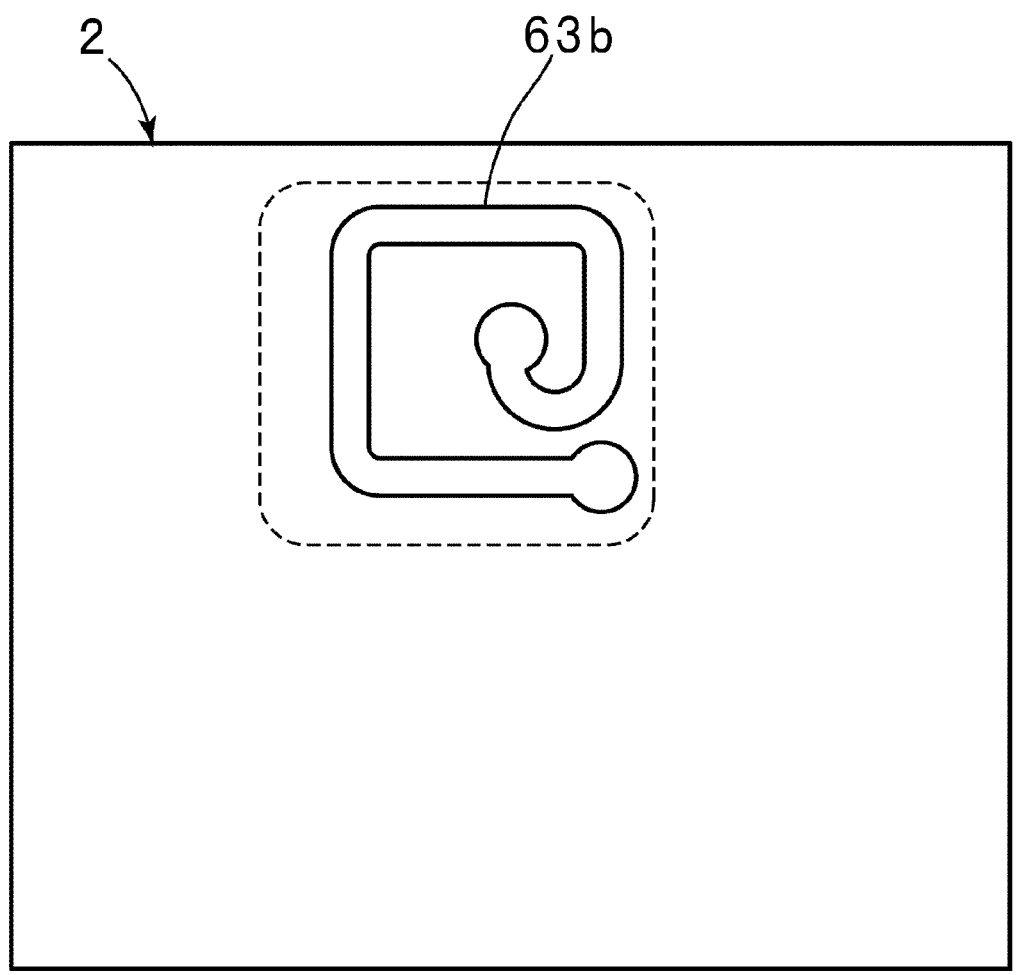
FIG. 5 is a plan view schematically illustrating a position at which a coil provided on a laminated substrate of the duplexer according to a preferred embodiment of the present invention is disposed.

On the other hand, in the present preferred embodiment, no shield electrodes corresponding to the shield electrodes 521 and 522 are provided at a vertical position above the coil patterns, as illustrated in FIG. 5. Thus, according to the present preferred embodiment, balance characteristics can be improved without providing large shield electrodes on the middle layers, especially on the layers above the coil pattern 63b.

Figure 8:
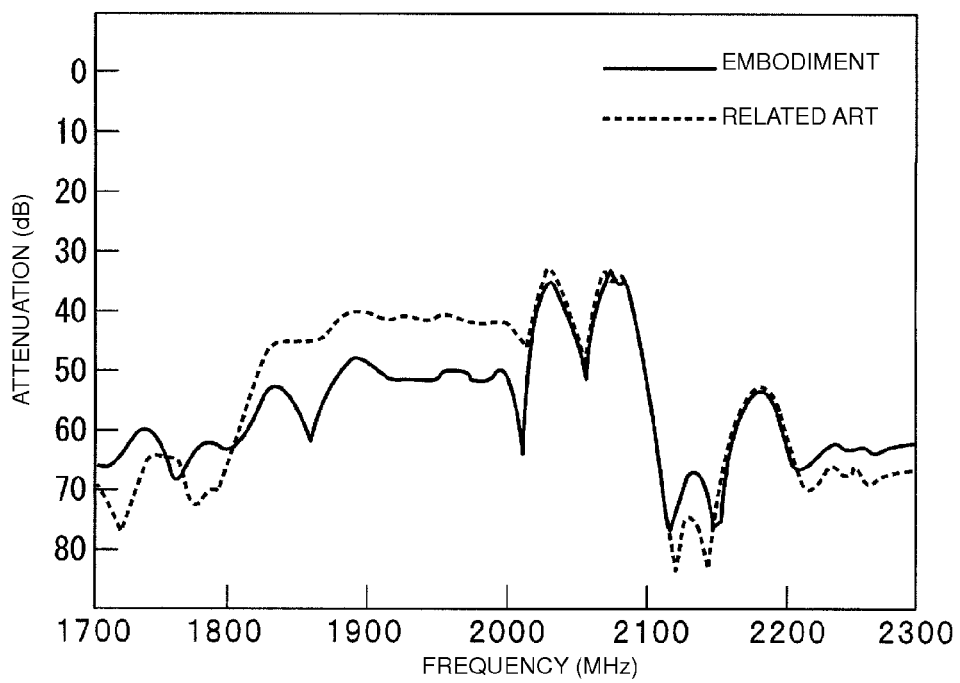
FIG. 8 is a diagram illustrating the isolation characteristics of a duplexer according to a preferred embodiment of the present invention and a conventional duplexer prepared for comparison.
Figure 9:
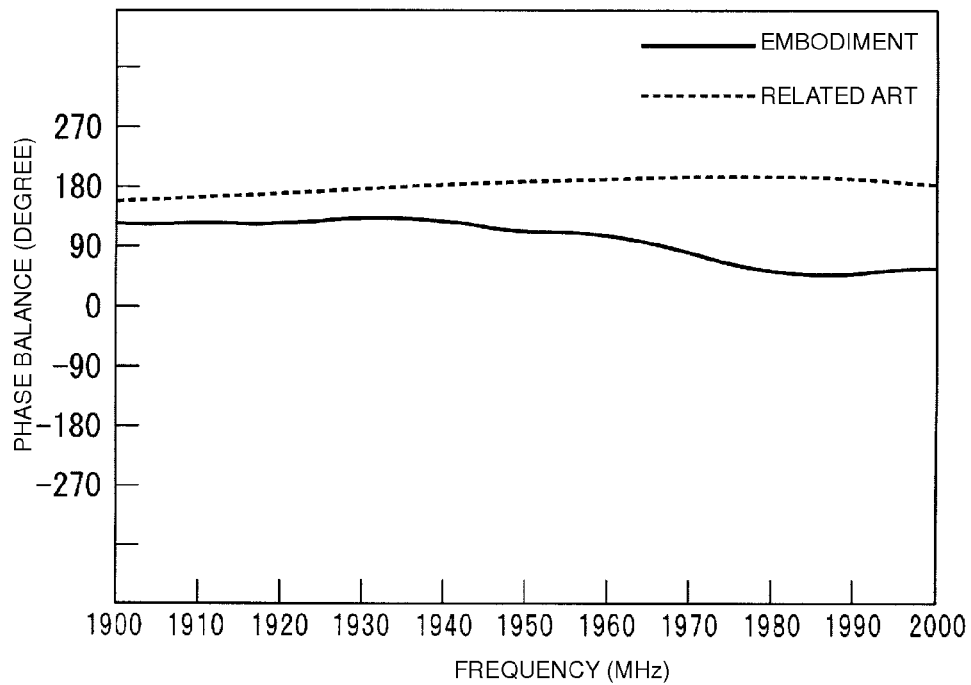
FIG. 9 is a diagram illustrating the relationship between the phase balance and the frequency in a duplexer of a preferred embodiment of the present invention and a duplexer in a conventional duplexer prepared for comparison.

FIG. 8 illustrates isolation-frequency characteristics in the duplexer of the above-described preferred embodiment and the duplexer of the related art. FIG. 9 illustrates a relationship between phase balance and frequency. The transmission band is 1920 MHz to 1980 MHz, and the reception band is 2110 MHz to 2170 MHz.

As shown in FIG. 8, according to the above-described preferred embodiment, increased attenuation for the isolation characteristics can be achieved as compared to the related art. In addition, as shown in FIG. 9, according to the above-described preferred embodiment, enhanced phase balance can be achieved as compared to the comparative example.

Figure 10:
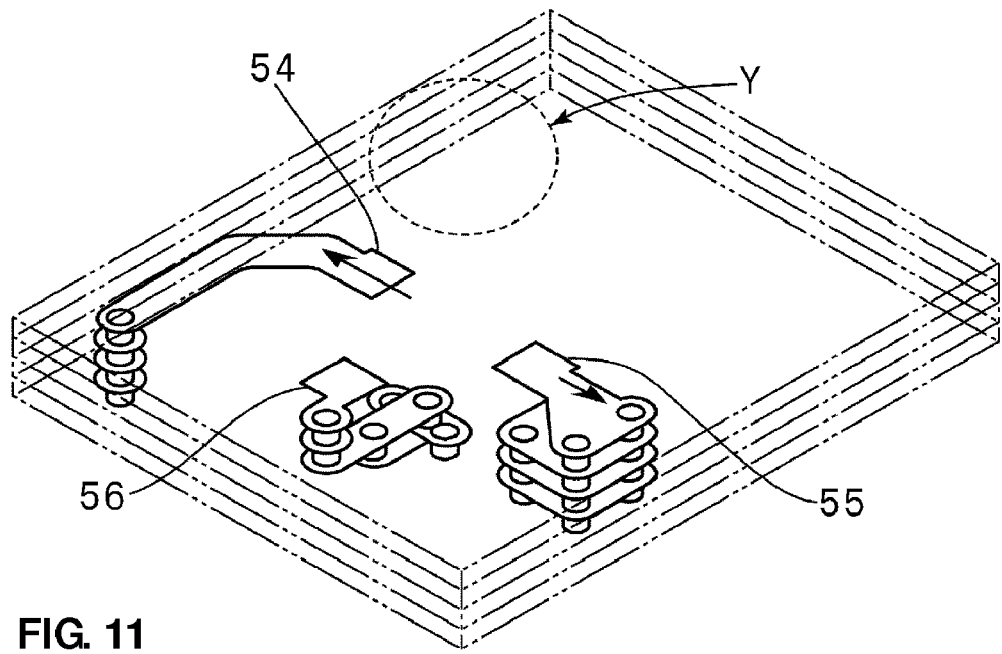
FIG. 10 is a perspective view schematically illustrating the positions of each of conductive paths connecting first and second ground lands and a balanced ground land to first to third ground terminals according to a preferred embodiment of the present invention.
Figure 11:
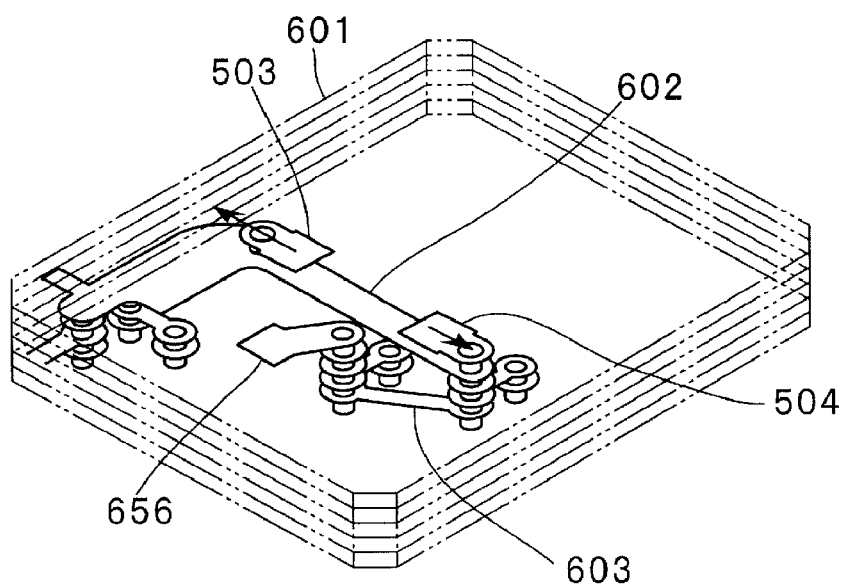
FIG. 11 is a schematic perspective view of a structure in which first and second ground lands and a balanced ground land which were prepared for comparison are commonly connected inside a laminated substrate.

FIG. 10 is a perspective view schematically illustrating the conductive paths D and E in the duplexer 1 of according to the preferred embodiment described above. In contrast, FIG. 11 is a perspective view schematically illustrating conductive paths D and E according the related art prepared for comparison. In FIG. 10, to simplify viewing, the first layer on the side of the bottom surface 2b of the laminated substrate 2 is omitted, and only the second to five layers are shown. Likewise, in FIG. 11, the first layer on the side of the bottom surface of the laminated substrate is omitted, and only the second to sixth layers are shown.

In the example of the related art illustrated in FIG. 11, the first and second ground lands 503 and 504 are commonly connected by a common ground conductor 602. The balanced ground land 507 is also electrically connected to the first and second ground lands 503 and 504 through a conductor 603 provided inside the laminated substrate 501.

On the other hand, according to the above-described preferred embodiment, as illustrated in FIG. 10, the first and second ground lands 54 and 55 are independent of each other inside the second to fifth layers until they are connected to the common ground electrode provided between the first and second layers of the laminated substrate 2. In addition, the balanced ground land 56 is connected to the third ground terminal provided on the bottom surface of the laminated substrate 2, independently of the first and second ground lands 54 and 55. Note that a position indicated by a broken line Y indicates a position at which the coil is defined by the coil patterns described above.

According to the preferred embodiments of the present invention, it is possible to independently adjust the intensity of the ground for each of the first and second ground lands 54 and 55. In addition, it is possible to adjust conductive paths D and E respectively connecting the first and second ground lands 54 and 55 to the first and second ground terminals 34 and 35 in accordance with the distance from the coil Y described above. For example, the balance characteristics can be improved by setting the ground intensity for a conductive path positioned closer to the coil Y to be relatively low and setting the ground intensity for a conductive path positioned farther from the coil Y to be relatively high. That is, the phase balance and amplitude-phase balance of signals output from the first and second balanced terminals can be improved. This will be described with reference to FIG. 12 to FIG. 14.

Figure 12:
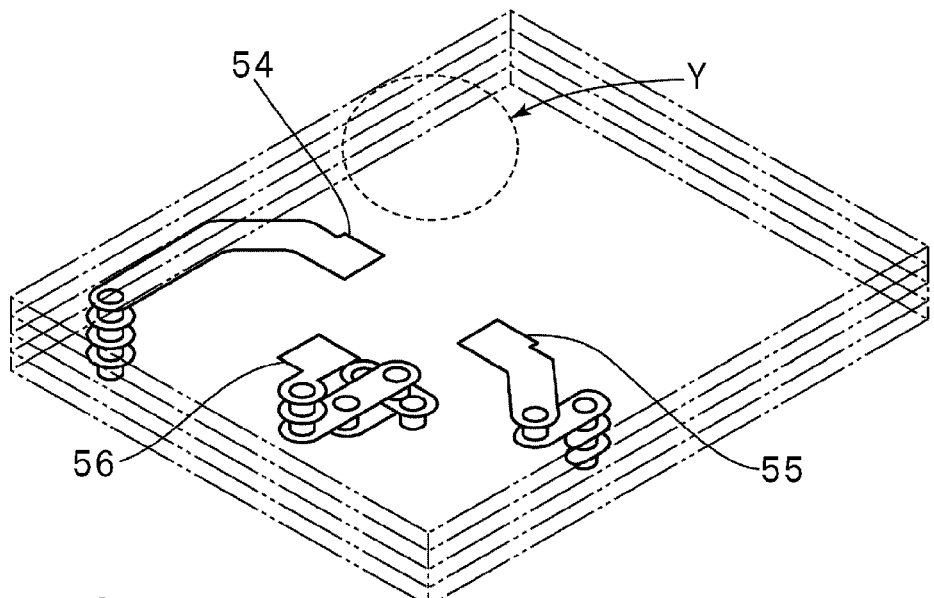
FIG. 12 is a schematic perspective view for describing main components of a laminated substrate of a comparative example.

FIG. 12 illustrates a first comparative example which was prepared for comparison. In the first comparative example, the ground intensity for the conductive path D was set to be equal or substantially equal to the ground intensity for the conductive path E. In the preferred embodiment shown in FIG. 10, four via-hole conductors are provided on each of the second to fourth layers provided between the second ground land 55 and the common ground 70. On the other hand, in FIG. 12, one via-hole conductor was provided on each of the second to fourth layers between the second ground land 55 and the common ground. In addition, a conductor connected to the via-hole conductor 65a penetrating the fifth layer was configured to have an elongated shape. With this arrangement, in the comparative example, the second inductance component between the second ground land 55 and the common ground 70 was set to be equal or substantially equal to the first inductance component between the first ground land 54 and the common ground 70.

In addition, in the preferred embodiment illustrated in FIG. 10, the conductive paths D, E, and F were preferably set to have the following distances from the coil and the following ground intensities. In the following, the inductance value of an inductance component is given as a parameter of ground intensity.

Conductive path D: the distance from the coil was set to be about 0.55 mm and the ground intensity was set to be about 0.91 nH.

Conductive path E: the distance from the coil was set to be about 1.46 mm, and the ground intensity was set to be about 0.56 nH.

In addition, the ground intensity of the conductive path F was set to be about 0.66 nH.

Figure 13:
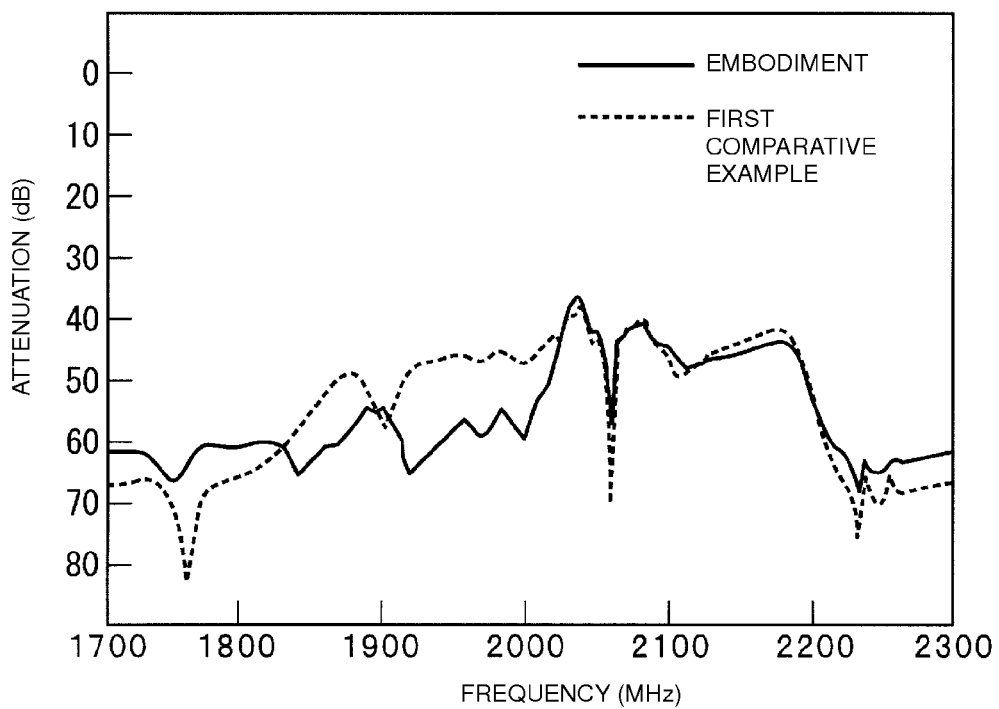
FIG. 13 is a diagram illustrating the isolation characteristics in the preferred embodiment shown in FIG. 10 and in the comparative example shown in FIG. 11.
Figure 14:
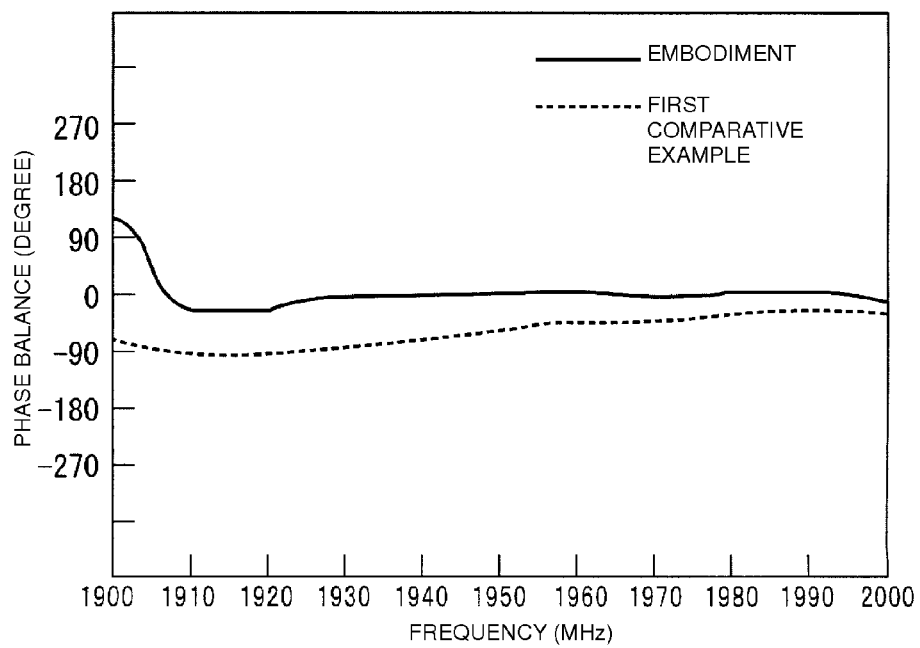
FIG. 14 is a diagram illustrating a relationship between the phase balance and the frequency in the preferred embodiment shown in FIG. 10 and in the comparative example shown in FIG. 11.

FIG. 13 shows attenuation/isolation characteristics in the preferred embodiment illustrated in FIG. 10 and in the first comparative example illustrated in FIG. 12. FIG. 14 shows phase balance characteristics.

As shown in FIGS. 13 and 14, according to the preferred embodiment described above, the isolation characteristic can be improved as compared to the related art, and the phase balance can also be improved.

Figure 15:
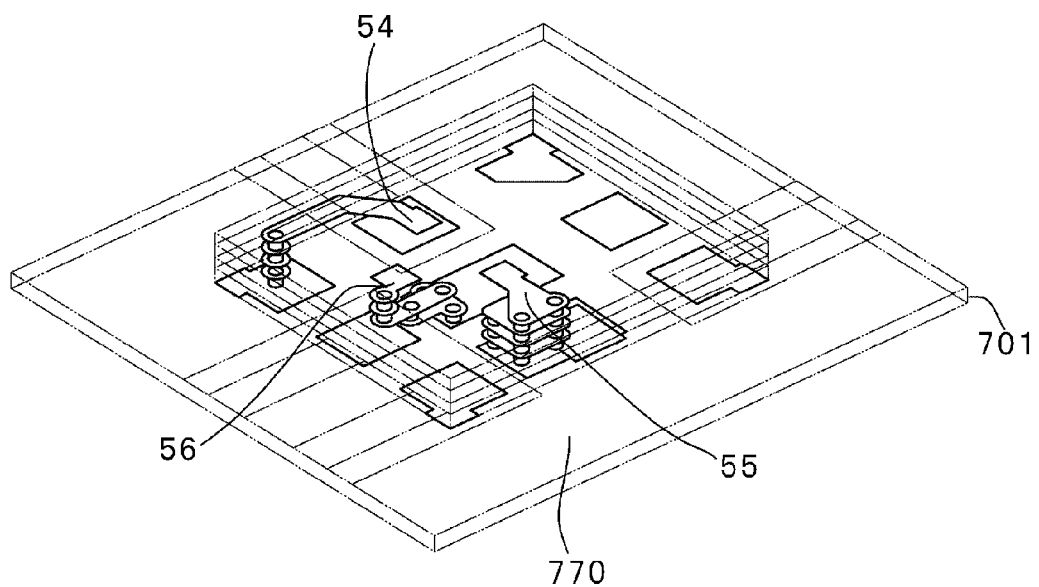
FIG. 15 is a schematic perspective view illustrating a mount substrate used in a modification of a preferred embodiment of the present invention.
Figure 16:
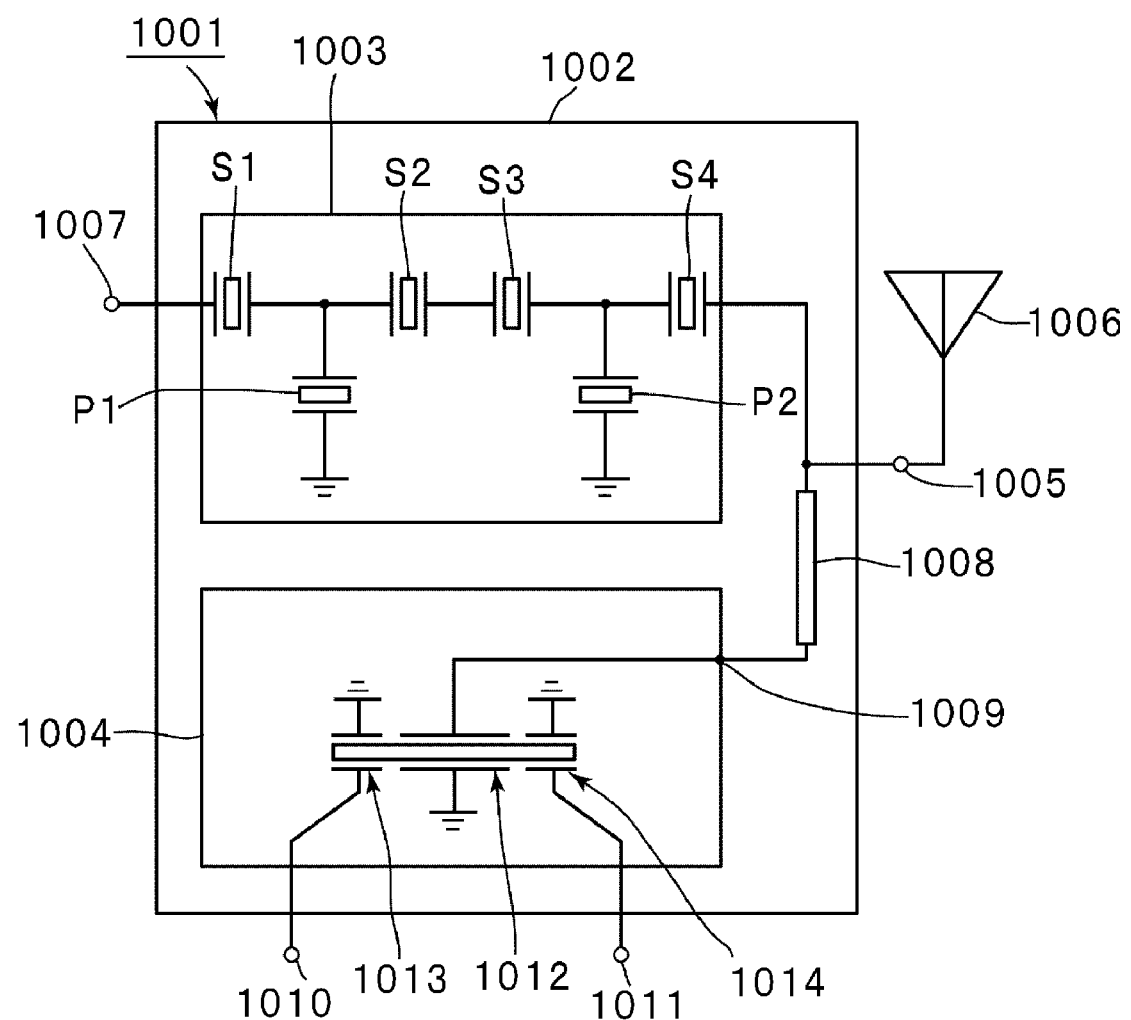
FIG. 16 is a schematic view illustrating a circuit configuration of a conventional duplexer.

FIG. 15 illustrates a mount substrate 701 according to a modification of a preferred embodiment of the present invention. In the preferred embodiment described above, the first and second ground lands 54 and 55 are provided with the common ground electrode 70 between the first and second layers of the laminated substrate 2. In this modification, no common ground electrode is provided on the laminated substrate 2, and a common ground electrode 770 is provided on the mount substrate 701 on which a laminated substrate is mounted. One of the ends of each of the first and second inductance components is connected to the common ground electrode 770 provided on the mount substrate 701. With the arrangement in which the conductive paths D, E, and F are independent of each other within the laminated substrate 2, unnecessary interference can be prevented, and impedance matching can be independently provided.

In the preferred embodiment described above, the reception elastic wave filter 4 and the transmission elastic wave filter 3 are preferably defined by surface acoustic wave filters. However, it is also possible to construct a transmission filter and reception filter as elastic boundary wave filters. It is also possible that either the transmission filter or the reception filter is defined by a surface acoustic wave filter, and the other is defined by an elastic boundary wave filter.

The circuit configuration of the reception elastic wave filter 4 is not limited to the above-described structure which is schematically illustrated in FIG. 1, and elastic wave filters having various electrode structures provided with balanced-unbalanced conversion functions may preferably be used. Similarly, the circuit configuration of the transmission elastic wave filter 3 is not limited to the above-described circuit configuration illustrated in FIG. 3, and various electrode structures of elastic wave filters may preferably be used.

The frequency bands of the transmission filter and the reception filter are not limited to the frequency bands used in the preferred embodiments described above. And, preferred embodiments of the present invention can be applied to duplexers for various frequency bands.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A duplexer comprising:
a transmission elastic wave filter;
a reception elastic wave filter; and
a laminated substrate on which the transmission elastic wave filter and the reception elastic wave filter are provided; wherein
the transmission elastic wave filter includes a first piezoelectric substrate, a first filter unit provided on the first piezoelectric substrate, and a transmission output pad provided on a bottom surface of the first piezoelectric substrate and connected to the first filter unit;
the reception elastic wave filter includes a second piezoelectric substrate, a second filter unit provided on the second piezoelectric substrate, an unbalanced pad, and first and second balanced pads, the unbalanced pad and the first and second balanced pads being provided on a bottom surface of the second piezoelectric substrate and connected to the second filter unit;
the second filter unit comprises:
a first longitudinally-coupled filter device including at least one first IDT having one end connected to the unbalanced pad, and a second longitudinally-coupled filter device including at least one second IDT having one end connected to the unbalanced pad, in which a phase of an output signal relative to an input signal is different by 180 degrees from the phase of an output signal relative to an input signal in the first filter device;
a first ground pad to which another end of the at least one first IDT is connected; and
a second ground pad to which another end of the at least one second IDT is connected;
the laminated substrate comprises:
first and second ground lands electrically connected to the first and second ground pads, respectively, a common land electrically connected to the transmission output pad and the unbalanced pad, and a common ground electrode to which the first and second ground lands are commonly connected;
a first inductance component connected between the first ground land and the common ground electrode;
a second inductance component connected between the second ground land and the common ground electrode; and
a coil connected between the common land and the common ground electrode; and
a distance between the second ground pad and the coil is greater than a distance between the first ground pad and the coil, and the second inductance component is less than the first inductance component.

2. The duplexer according to claim 1, wherein
the laminated substrate includes a plurality of dielectric layers, and the common ground electrode is provided between adjacent dielectric layers of the plurality of dielectric layers of the laminated substrate;
the first and second inductance components and the coil are each provided with conductors provided on a top surface of the laminated substrate and/or on an interface between adjacent dielectric layers of the plurality of dielectric layers of the laminated substrate and with via-hole conductors penetrating at least one of the dielectric layers and connected to the conductors; and an overall length of a structure defined by continuously arranging the conductors and the via-hole conductors defining the first inductance component is greater than an overall length of a structure defined by continuously arranging the conductors and the via-hole conductors defining the second inductance component.

3. The duplexer according to claim 2, wherein the via-hole conductors defining the second inductance component include at least two via-hole conductors penetrating at least one of the dielectric layers.

4. The duplexer according to claim 2, wherein at least one of the plurality of dielectric layers is arranged between the first and second ground pads provided on the laminated substrate and the common ground electrode.

5. The duplexer according to claim 2, wherein the conductors of the coil are arranged so as not to overlie any conductor connected to the common ground electrode other than the conductors of the coil when the laminated substrate is viewed in plan.

6. The duplexer according to claim 1, wherein the elastic wave is an elastic boundary wave.

7. The duplexer according to claim 1, wherein the elastic wave is a surface acoustic wave.

8. An elastic wave device comprising:
an elastic wave filter;
a laminated substrate having a top surface and a bottom surface, the elastic wave filter being mounted on the top surface; and
first and second balanced terminals provided on the bottom surface of the laminated substrate; wherein
the elastic wave filter includes a piezoelectric substrate, an unbalanced pad and first and second balanced pads provided on the piezoelectric substrate, a first longitudinally-coupled filter device including at least one first IDT having one end connected to the unbalanced pad, and a second longitudinally-coupled filter device including at least one second IDT having one end connected to the unbalanced pad, in which a phase of an output signal relative to an input signal is different by 180 degrees from a phase of an output signal relative to an input signal in the first filter device;
the laminated substrate comprises:
a first ground land electrically connected to another end of the at least one first IDT and a second ground land electrically connected to another end of the at least one second IDT;
a common ground electrode to wherein at least one of the plurality of dielectric layers is;
a first inductance component provided between the first ground land and the common ground electrode; and
a second inductance component provided between the second ground land and the common ground electrode;
a magnitude of the first inductance component is different from a magnitude of the second inductance component; and
the first ground land and the second ground land are spaced apart from and not structurally connected to one another.

* * * * *